(12) United States Patent
Vinet et al.

(10) Patent No.: US 8,722,499 B2
(45) Date of Patent: May 13, 2014

(54) METHOD FOR FABRICATING A FIELD EFFECT DEVICE WITH WEAK JUNCTION CAPACITANCE

(75) Inventors: Maud Vinet, Rives (FR); Laurent Grenouillet, Rives (FR); Yannick Le Tiec, Crolles (FR); Nicolas Posseme, Carantec (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/357,061

(22) Filed: Jan. 24, 2012

(65) Prior Publication Data
US 2012/0190214 A1   Jul. 26, 2012

(30) Foreign Application Priority Data
Jan. 24, 2011   (FR) ...................... 11 00201

(51) Int. Cl.
*H01L 21/336*   (2006.01)
(52) U.S. Cl.
USPC .................................. 438/296; 257/E21.564
(58) Field of Classification Search
USPC ............... 257/E21.24, E21.564, E21.573; 438/421, 411, 319, 783, 219, 220, 221, 438/412, 294–296
See application file for complete search history.

(56) References Cited

U.S. PATENT DOCUMENTS

| 7,429,504 | B2* | 9/2008 | Kim et al. | 438/191 |
| 2001/0036693 | A1* | 11/2001 | Brigham et al. | 438/183 |
| 2002/0182787 | A1* | 12/2002 | Bae | 438/149 |
| 2004/0108558 | A1* | 6/2004 | Kwak et al. | 257/410 |
| 2004/0124467 | A1* | 7/2004 | Stettler et al. | 257/347 |
| 2004/0164305 | A1 | 8/2004 | Keshavarzi et al. | |
| 2004/0217434 | A1* | 11/2004 | Lee et al. | 257/412 |
| 2005/0045947 | A1* | 3/2005 | Chen et al. | 257/336 |
| 2007/0246752 | A1 | 10/2007 | Cheng et al. | |
| 2008/0006901 | A1 | 1/2008 | Furukawa | |
| 2008/0265323 | A1 | 10/2008 | Miyairi | |
| 2012/0187488 | A1* | 7/2012 | Grenouillet et al. | 257/347 |

* cited by examiner

*Primary Examiner* — Daniel Luke
*Assistant Examiner* — Latanya N Crawford
(74) *Attorney, Agent, or Firm* — Oliff PLC

(57) ABSTRACT

The field effect device is formed on a substrate of semiconductor on insulator type provided with a support substrate separated from a semiconductor film by an electrically insulating layer. The source and drain electrodes are formed in the semiconductor film on each side of the gate electrode. The electrically insulating layer comprises a first area having a first electric capacitance value between the semiconductor film and the support substrate facing the gate electrode. The electrically insulating layer comprises second and third areas having a higher electric capacitance value than the first value between the semiconductor film and the support substrate facing the source and drain electrodes.

5 Claims, 2 Drawing Sheets

METHOD FOR FABRICATING A FIELD EFFECT DEVICE WITH WEAK JUNCTION CAPACITANCE

BACKGROUND OF THE INVENTION

The invention relates to a method for fabricating a field effect device integrated on a substrate of semiconductor on insulator type.

STATE OF THE ART

The use of field effect transistors formed on substrates of silicon on insulator type presents numerous advantages, in particular simplification of the design of the integrated circuits and an improvement of the performances of the devices.

Furthermore, the keen interest in this type of architecture also arises from the fact that the transistor integration layouts are hardly modified as only the substrate has been replaced, which enables a controlled fabrication process to be kept.

In order to meet increasingly stringent technological constraints, the transistors used are smaller and smaller and the substrates used have thinner and thinner thicknesses of silicon and buried oxide. This modification of the substrate parameters should normally enable good control of drain induced barrier lowering which is a parasitic effect linked to propagation of the field lines in the transistor.

However the use of a transistor integrated on an increasingly thin electrically insulating film also presents a large number of drawbacks. As the dimensions of the transistor are continually reduced, an increase of the parasitic components of the transistor occurs. The main effect of this increase of the parasitic components is to reduce the operating speed of the circuit and therefore to reduce the benefits linked to reduction of the dimensions of the transistor.

This results in the transistor on insulator, in its current configuration, no longer appearing to be advantageous, as the gains in performance are limited in particular from the dynamic point of view.

SUMMARY OF THE INVENTION

It has been observed that a requirement exists to provide a method for fabricating such a field effect device that is easy to implement and that can be easily co-integrated with electronic circuit fabrication methods.

The device is fabricated according to a method comprising the following steps:
- providing a substrate successively provided with a support substrate, an electrically insulating layer with a first dielectric constant, a semiconductor material film, a gate dielectric material, a gate electrode, a source area and a drain area, the source and drain areas being separated by the gate electrode,
- partially eliminating the electrically insulating layer between the support substrate and the semiconductor film so as to form suspended source and drain areas supported by a first mechanical support area between the semiconductor film and the support substrate along the gate electrode,
- depositing an electrically insulating material between the source and drain areas and the support substrate so as to form areas having a lower dielectric constant than the support area between the support substrate and semiconductor film.

BRIEF DESCRIPTION OF THE DRAWINGS

Other advantages and features will become more clearly apparent from the following description of particular embodiments of the invention given for non-restrictive example purposes only and illustrated by means of the appended drawings, in which.

DESCRIPTION OF A PREFERRED EMBODIMENT OF THE INVENTION

Figure 1:
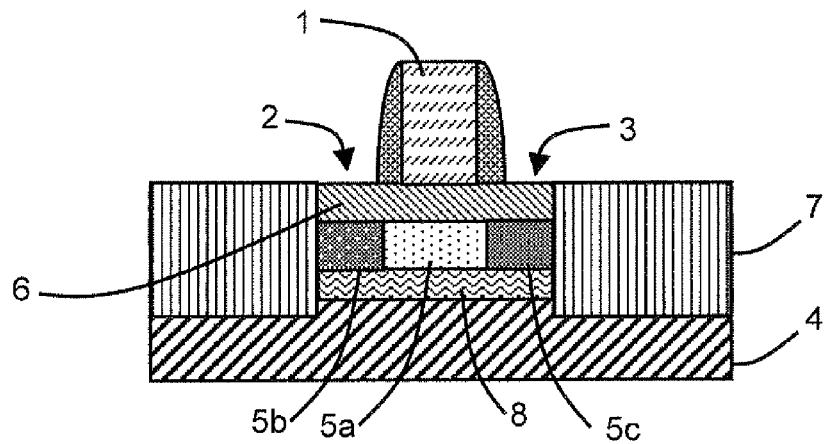
FIG. 1 schematically illustrates a particular embodiment of a transistor on insulator, in cross-section, FIGS. 2 to 5 schematically illustrate a particular method for implementation of a transistor on insulator, in cross-section, FIG. 6 schematically illustrates a variant of implementation of a transistor on insulator, in cross-section.

As illustrated in FIG. 1, the transistor comprises a gate electrode 1, a source electrode 2 and a drain electrode 3. The transistor is made on a substrate of semiconductor on insulator type which comprises a support substrate 4, an electrically insulating layer 5 and a semiconductor film 6 called active layer on which the transistor is formed. Support substrate 4 is separated from semiconductor film 6 by electrically insulating layer 5.

Gate electrode 1 is separated from semiconductor film 6 by a gate dielectric material (not shown). The gate dielectric is an electrically insulating material, for example silicon oxide, a silicon nitride or a material presenting a higher dielectric constant than the latter such as hafnium oxide.

Source electrode 2 and drain electrode 3 are arranged on each side of gate electrode 1 and are at least partially formed in semiconductor film 6. In semi-conductor film 6, source electrode 2 and drain electrode 3 are separated by a conduction channel which is located directly underneath gate electrode 1. In certain embodiments, it can be envisaged to thicken semiconductor film 6 at the level of the source and drain areas by a selective epitaxy step. A semi-conductor material of the same nature as the semiconductor film or a material of different nature is deposited on the source/drain areas.

In certain embodiments where the transistor is fabricated with other active devices on the substrate, the transistor is electrically insulated from the rest of the substrate by means of an insulating pattern 7. Insulating pattern 7 is made in an electrically insulating material which surrounds the transistor. Insulating pattern 7 sinks into semiconductor film 6. It can also sink into electrically insulating layer 5 and into support substrate 4. In a cross-sectional plane parallel to the interface between support substrate 4 and electrically insulating layer 5, insulating pattern 7 defines a closed peripheral pattern inside which an active area is defined in semiconductor film 6. This active area contains the source electrode, drain electrode and conduction channel.

In order to obtain a device having improved electric performances, electrically insulating layer 5 presents distinct areas. These distinct areas form different capacitors. There is a first capacitor whose electrodes are formed by the channel and support substrate 4 and are separated by electrically insulating layer 5. Second and third capacitors are present and successively comprise support substrate 4, electrically insulating layer 5 and source or drain electrodes 3.

The coupling capacitance value is measured between support substrate 4 and semiconductor film 6 in the facing portions. The coupling capacitance value takes account of the different materials that are to be found between support substrate 4 and semiconductor film 6 and of their thickness. Insulating layer 5 can be broken down into three areas, each area being associated with a capacitor and therefore with this specific part of the transistor and of the semiconductor film.

The coupling capacitance value also takes account of the surface of the electrodes facing one another.

The first area 5a is located facing gate electrode 1, here underneath the gate electrode and therefore underneath the conduction channel. First area 5a presents a first dielectric constant or permittivity value between the support substrate and semiconductor film 6. First area 5a forms part of the first capacitor with a first coupling capacitance value per surface unit.

A second area 5b is located facing source electrode 2 and presents a second dielectric constant value. Second area 5b forms part of the second capacitor with a second coupling capacitance value per surface unit. The second coupling capacitance value per surface unit is lower than the first coupling capacitance value per surface unit. This difference between the first and second coupling capacitance values per surface unit can arise from the fact that the value of the dielectric constant of electrically insulating layer 5 in the second area is lower than the first dielectric constant value in first area 5a, the distance separating the electrodes being identical between areas 5a and 5b. This difference can also arise from the fact that the distance that separates the two electrodes is greater in second area 5b than in first area 5a, the material forming the electrically insulating layer being identical in first and second areas 5a and 5b. This difference of coupling capacitance can further arise from a combination of the above two cases.

A third area 5c is located facing drain electrode 3 and presents a third coupling capacitance value per surface unit. The third coupling capacitance value per surface unit is lower than the first coupling capacitance value per surface unit. The difference between the first and third coupling capacitance values can arise from the same reasons as those explained in the foregoing for the second coupling capacitance.

In the remainder of the description, the term coupling capacitance per surface unit is replaced by the term coupling capacitance. The coupling capacitance per surface unit corresponds to the ratio between the permittivity of the dielectric present between the two electrodes of the capacitor and the distance separating the electrodes. This architecture enables the coupling capacitance to be reduced (by modifying the coupling capacitance per surface unit) without modifying the design of the transistor.

The difference of coupling capacitance is observed between semiconductor film 6 and support substrate 4, i.e. it arises from a difference of thickness between the facing areas and/or from a difference of material used between the two electrodes of the capacitor which results in a difference of the permittivity over thickness ratio ($\in$/e).

The use of a transistor having a weaker capacitance underneath source 2 and drain 3 electrodes compared with that which is present underneath gate electrode 1 enables the electrostatic coupling between the source/drain electrodes and the substrate to be reduced thereby enabling a faster transistor to be obtained than with a homogeneous insulating film 5. Preserving a higher capacitance underneath the conduction channel enables a large electrostatic coupling with support substrate 4 to be kept. This configuration is particularly interesting for example when a counter-electrode is used in support substrate 4. This architecture enables the parasitic capacitances at the level of source 2 and drain 3 electrodes to be reduced while at the same time enabling the transistor to take advantage of good control of short channel effect and of threshold voltage modulation effects. This architecture improves the dynamic performances of the transistor without impairing its static performances.

Electrically insulating layer 5 can be formed by a single material that is present between support substrate 4 and semiconductor film 6 facing the different electrodes. The material then presents variable thicknesses so as to have a weaker coupling at the level of the source/drain electrodes compared with the coupling in the conduction channel.

Electrically insulating layer 5 can also be formed by a stack of several layers with variable thicknesses according to the areas in order to obtain a variation of the global dielectric constant. Stacking of the layers is performed in a direction that connects support layer 4 to semiconductor film 6.

The previous two embodiments can be combined in order to have an electrically insulating layer comprising different constituents and different materials underneath gate 1 and underneath the source/drain electrodes.

In yet another embodiment which can be combined with the previous embodiments, the variation of capacitance can also result from the use of different materials according to the capacitors. Thus, for example purposes, a first electrically insulating material is used underneath gate electrode 1 with a first dielectric constant. This first material forms the electrically insulating layer in area 5a. A second electrically insulating material is used underneath source electrode 2 and forms the electrically insulating layer in area 5b. A third electrically insulating material is used underneath drain electrode 3 and forms the electrically insulating layer in area 5c. There is then a stack of layers in the direction parallel to the axis connecting source electrode 2 to drain electrode 3. The second and third materials are chosen such as to have a lower dielectric constant than that of the first material if the thickness between the three areas is identical.

In a particular embodiment, the thickness of electrically insulating layer 5 is constant and there are different materials that are used to define the different areas 5a, 5b and 5c. In a particular embodiment, areas 5b and 5c are formed by the same material and area 5a is formed by another material.

Depending on the embodiments used, the difference of capacitance between the different areas 5a, 5b and 5c can result from the use of several layers having different dielectric constants. The difference of capacitance can further be obtained by using identical films but with different thicknesses. As indicated in the foregoing, it is also possible to combine these two embodiments.

In a privileged embodiment, the value of the second capacitance is equal to that of the third capacitance (for equal surfaces). These two areas can then have identical materials with the same thickness or with different thicknesses with materials compensating this thickness difference.

In an even more privileged embodiment which can be combined with the previous embodiment, second 5b and/or third area 5c can comprise a void area or be formed by a void. The use of a void area enables a low dielectric constant and therefore a weak coupling with respect to source 2 and drain 3 electrodes to be easily obtained. The void area is an insulating area which can be formed by a gaseous element with a predefined pressure, for example a gas at sub-atmospheric pressure. The source electrode and/or drain electrode is then suspended above support substrate 4, and area 5a acts as mechanical support area.

In an embodiment that can be combined with the previous embodiments, support substrate 4 comprises a counter-electrode 8 which is formed facing gate electrode 1 and advantageously facing source 2 and drain 3 electrodes. Counter-electrode 8 enables operation of the transistor to be modified by modulating the coupling with the conduction channel.

In advantageous manner, insulating pattern 7 surrounds the transistor and seals off access to second area 5b and/or to third area 5c when the latter is void. The void area is delineated by support substrate 4 and semiconductor film 6. It is delineated laterally by first area 5a and by insulating pattern 7 by means of a side wall of insulating pattern 7 which connects semiconductor film 6 to support substrate 4. This side wall is preferably flat. This configuration does not enable access to be had to the void area throughout the implementation method, which increases the reliability of the transistor while at the same time reducing the risks of parasitic pollution remaining stuck in the void area. The same can be the case when second area 5b and/or third area 5c comprise(s) a void volume, for example when second 5b and/or third 5c area is/are partly formed by an insulating solid material and by a void.

Figure 2:
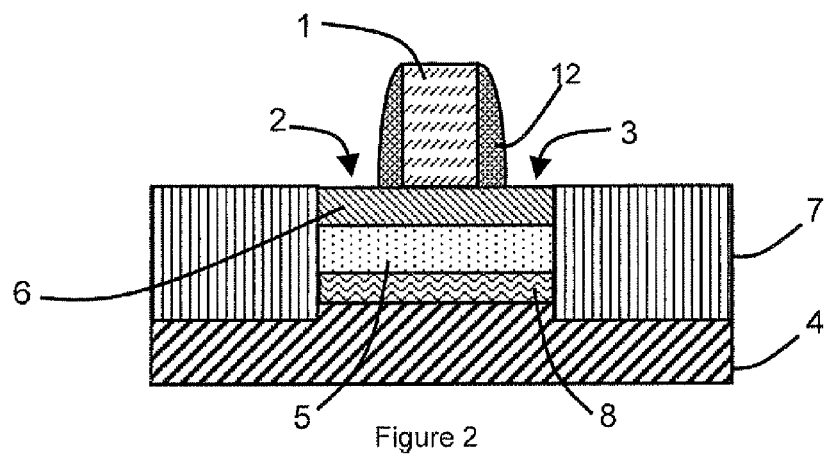

The transistor can be obtained simply in the following manner. As illustrated in FIG. 2, the transistor is produced in conventional manner up to formation of gate electrode 1 or source 2 and drain 3 electrodes by implantation. Semiconductor film 6 comprises a source area 2 and a drain area 3 separated by gate electrode 1. The source area can also have the name of source electrode if it is doped. The same is the case for the drain area.

In this way, the substrate of semiconductor on insulator type comprises a gate electrode 1 at its surface. The electrode can be associated with an insulating pattern 7 in order to delineate an active area in semiconductor film 6 and possibly in electrically insulating layer 5.

Figure 3:
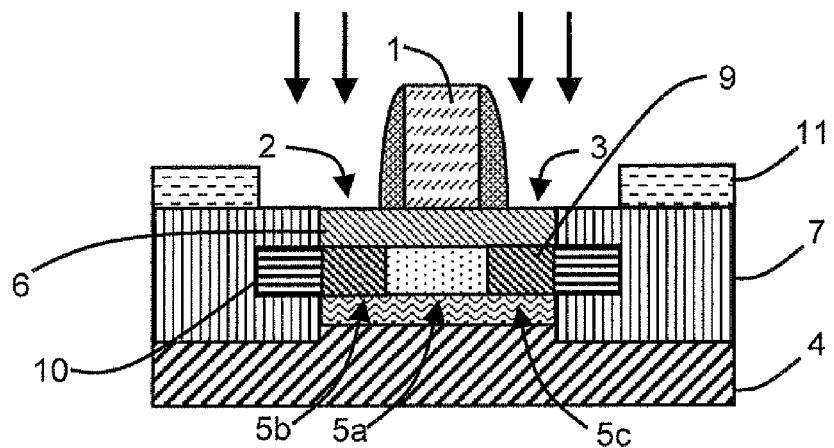

In a first implementation method illustrated in FIG. 3, electrically insulating layer 5 is modified by implantation to form two different materials presenting an etching selectivity between them. Formation of a sacrificial material 9 takes place by implantation.

In this instance, a new material is formed underneath the uncovered areas. Sacrificial material 9 is formed by implantation in the material initially forming electrically insulating layer 5. After the implantation step, there are, in layer 5, areas of sacrificial material 9 and areas made from material to be kept.

The implantation mask used defines the dimensions and positions of the areas to be eliminated and the areas to be kept. The implantation mask can for example be formed by a photoresist 11 or by any other material. The implantation mask can also be formed by gate 1.

The void areas of the mask define the areas to be eliminated and the solid areas define the areas to be kept. In this first embodiment, it is interesting to keep the initial material of layer 5 underneath gate electrode 1 to form area 5a.

If the implantation mask is formed by a photoresist, it is advantageous to arrange the mask above the gate and to cover the gate in order to define a broader area 5a than the gate.

In a particular embodiment also illustrated in FIG. 3, the implantation step also forms an additional sacrificial material 10 in insulating pattern 7.

In an alternative embodiment, gate electrode 1 is used as implantation mask. It is advantageous to use gate electrode 1 as implantation mask as this enables self-alignment of the gate electrode with first area 5a to be achieved. Depending on the embodiments, implantation can be performed with a zero or non-zero implantation angle. Implantation with a zero angle enables an area 5a to be defined having the same dimensions as gate electrode 1 with its lateral spacers 12 if any. Implantation with a non-zero angle enables the dimensions of area 5a to be reduced with respect to the physical dimensions of gate electrode 1 thereby making it possible to take account of diffusion of the dopants, for example underneath lateral spacers 12.

In an alternative embodiment as illustrated in FIG. 3, the implantation mask is made partly by gate electrode 1 and partly by photoresist 11. For example purposes, photoresist 11 forms a pattern above insulating pattern 7 in order to limit the extent of additional sacrificial material 10 in insulating pattern 7 while at the same time preserving self-alignment of first area 5a with respect to gate 1.

The lateral dimensions of first area 5a depend on the implantation angle, the size of gate electrode 1 (or of the implantation mask) and the use of lateral spacers 12, if this is the case.

The material implanted in the electrically insulating layer enables etching selectivity of sacrificial material 9 with respect to the other materials present to be obtained. For example, for an electrically insulating layer 5 made from silicon oxide, implantation of arsenic or indium is performed in order to form a doped silicon oxide which can be etched at a faster rate than non-doped silicon oxide. Etching is advantageously performed by means of hydrofluoric acid, preferably in the form of gaseous anhydrous HF.

In the case where insulating pattern 7 is made from the same material as electrically insulating layer 5, sacrificial material 9 and additional sacrificial material 10 are identical and react to the same etching chemistry. It is then possible to form a preferred degradation path of sacrificial material 9 passing via insulating pattern 7. The extent of the parasitic etching in insulating pattern 7 is linked to the etching selectivity that exists between sacrificial material 9 and the materials forming insulating pattern 7 and with respect to area 5a.

When gate electrode 1 is used as mask, it is advantageous to perform the formation operation of sacrificial material 9 at the same time as formation of the source 2 and drain 3 electrodes, if the dopant material is implanted with a concentration such that it allows formation of sacrificial material 9.

In this instance, after the implantation step, area 5a is located underneath gate electrode 1 and has substantially the same lateral dimensions as gate electrode 1. Area 5a corresponds to the volume of insulating layer 5 which was not implanted. Another part of layer 5 of sacrificial material 9 corresponds to areas 5b and 5c and is located underneath source 2 and drain 3 electrodes.

These two portions are formed by different materials and react to different etching chemistries and/or to the same etching chemistry but with different etch rates in order to obtain a certain etching selectivity.

Figure 4:
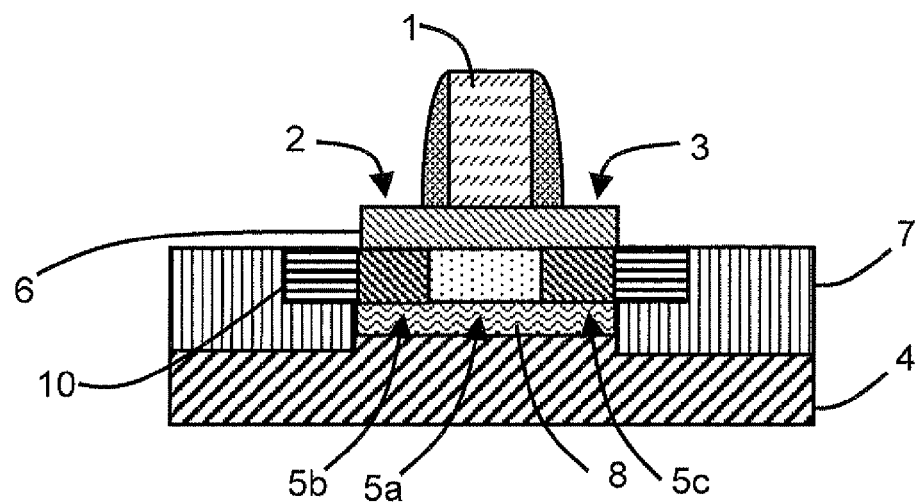
Figure 5:
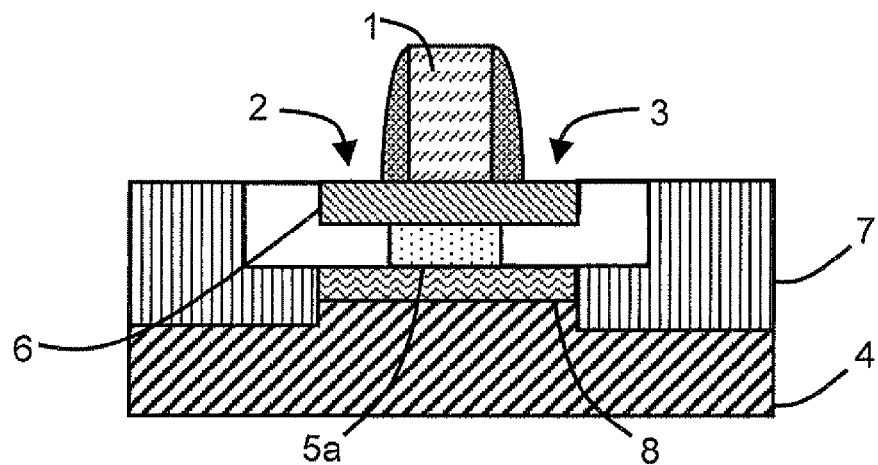

As illustrated in FIGS. 4 and 5, a first hole is formed in insulating pattern 7 and/or in semiconductor film 6 to have access to second area 5b of electrically insulating layer 5. A second hole is formed in the insulating pattern and/or in semiconductor film 6 to have access to third area 5c of electrically insulating layer 5.

In the embodiment illustrated in FIG. 4, the hole is formed by complete elimination of insulating pattern 7 over a part of the thickness of the latter so as to reach sacrificial material 9 and/or additional sacrificial material 10. In the illustrated example, the top part of insulating pattern 7 is eliminated in isotropic or anisotropic manner to allow access to additional sacrificial material 10 which will then give access to sacrificial material 9.

In the embodiment illustrated in FIG. 5, the hole is formed by elimination of a part of the surface of insulating pattern 7 to reach sacrificial material 9 and/or additional sacrificial material 10. In the illustrated example, only a part of insulating pattern 7 is accessible and etched. This localized etching is obtained for example by means of an etching mask associated with anisotropic etching, but isotropic etching is also possible The hole can have any shape and surface provided that the hole allows access to the sacrificial area.

As a variant, it can also be envisaged to only form a single hole which simultaneously gives access to the two areas 5b and 5c. In a particular implementation, insulating pattern 7 is eliminated around the transistor until second area 5b and third area 5c of insulating layer 5 are reached.

The hole is preferably formed in insulating pattern 7 as this enables the dimensional and alignment constraints to be relaxed to ensure access to electrically insulating layer 5. When the hole is formed in insulating pattern 7 or by elimination of insulating pattern 7, it is preferable to form additional sacrificial material 10 which will allow a greater flexibility in the forthcoming degradation process.

In another alternative embodiment, it can be envisaged to form source/drain electrodes that are partially made from porous silicon or porous silicide so as to allow access to the sacrificial layer without forming any holes in insulating pattern 7 or in the source/drain electrodes.

As illustrated in FIG. 5, once second area 5b and third area 5c of insulating layer 5 are accessible, these two areas are eliminated by means of a suitable etching chemistry.

In this way, first area 5a is preserved between gate electrode 1 and support substrate 4, and second area 5b and third area 5c are formed by void areas. First area 5a forms a mechanical support area which enables the source 2 and drain 3 areas to be suspended above support substrate 4. The suspended areas are located on each side of support area 5a. Due to the etching selectivity that exists between the sacrificial material and the material to be kept, the support area is located facing gate electrode 1, along the gate electrode. The support area at least partially supports the transistor throughout the process.

In an alternative embodiment, elimination of second area 5b and third area 5c of insulating layer 5 is performed by any suitable technique, for example by means of thermal degradation or degradation by electromagnetic or electronic radiation. These techniques are for example used to form interconnection structures with air-gaps. The hole formed then serves the purpose of removing the degradation sub-product.

In yet another alternative embodiment, the hole is not necessary if a porous electrically insulating material is present in insulating area 7 and enables a degradation agent and/or the degradation sub-product to pass through to electrically insulating layer 5. For example, two categories of materials can be envisaged, silicon oxides doped by hydrogen, carbon or fluorine and which are typically noted in the form SiOCH, SiCH or SiOF, and porous organic polymers not containing silicon such as carbon-based materials, for example a carbon matrix which is doped by hydrogen and noted CH or a carbon matrix doped by fluorine and noted CF.

It is also possible to use a material that is permeable to the degradation agent and/or to the degradation sub-product instead of the hole and the porous material. The porous or permeable material avoids formation of a hole which enables a high reliability of the device to be preserved.

Once electrically insulating layer 5 has been partially eliminated, here with elimination of sacrificial material 9, it presents areas with different dielectric constants according to the criteria defined in the foregoing.

The field effect device is electrically insulated from support substrate 4 and the source/drain electrodes do not have, opposite, the same dielectric material as the conduction channel.

In this embodiment, the portions of semiconductor film forming the source and drain electrodes are suspended. This configuration enables the stresses initially present or induced by the fabrication method to be at least partially relaxed. The semiconductor film is supported in suspension by means of the part of the electrically insulating layer that is facing the channel, which enables the set of stresses in the conduction channel to be maintained.

Relaxation of the set of stresses can be complete or almost complete if insulating pattern 7 is etched so as to reduce its thickness around the active area of the transistor to access the electrically insulating layer. The side walls of the semiconductor film are free. Relaxation of the set of stresses can be partial if access to the electrically insulating layer is obtained by means of a hole formed in insulating pattern 7 or in semiconductor film 6 which limits possible strains of the semiconductor film to relax. There can also be transformation or preservation of the set of initial stresses if access to electrically insulating layer 5 is obtained by means of a porous material, insulating pattern 7 remaining in contact with semiconductor film 6.

In a particular embodiment, it is then possible to fill the void areas with an additional insulating material that is different from the material constituting area 5a so as to enhance the electric reliability and mechanical stability of the structure while at the same time preserving good electrostatic properties. This additional insulating material is for example a material having a dielectric constant that is lower than that of silicon oxide, such as advantageously a porous material. The additional insulating material is for example deposited by spin-coating.

When the void area is filled by a new material, a new set of stresses can be introduced into source 2 and drain 3 electrodes and to a lesser extent into the conduction channel. By means of this embodiment, it is then possible to form a transistor with a complex set of stresses. The channel and source/drain electrodes are subjected to different sets of stresses. This embodiment enables two transistors having different sets of stresses to be co-integrated simply.

This embodiment is particularly interesting as it enables the areas to be eliminated to be easily delineated and self-alignment with respect to the conduction channel to be achieved. The set of stresses can therefore remain symmetric with respect to the conduction channel.

In another implementation method that can be combined with the previous embodiments, support substrate 4 and/or uncovered semiconductor film 6 can be partially etched in order to increase the distance between these two layers. Increasing the distance is favorable to obtaining a weaker capacitance underneath the source/drain electrodes compared with the conduction channel in the case where the same material is present facing the channel and the source/drain electrodes. It is also possible to use different materials to have a more marked effect.

As indicated in the foregoing, different techniques can be envisaged to have access to the second and third areas of insulating layer 5. It is also possible to perform simultaneous access to the two areas 5b and 5c or consecutive accesses. In the embodiments described in the foregoing, there is simultaneous access to areas 5b and 5c so as to empty the latter during the same technological step and if applicable to fill them at the same time.

It can also be envisaged to empty them consecutively using different masks to access the source area or the drain area. It is further possible to use a single mask with a plug which masks one of the two areas.

It is further possible to fill the areas at the same time with the same material or to use different materials. If different materials are used between the source and drain, it is advantageous to consecutively eliminate areas 5b and 5c to fill them progressively or to use a plug to protect one area while the other is filled with the required insulator. This embodiment enables area 5b to be formed with a particular material and area 5c to be formed with a different material, as illustrated in FIG. 1. The deposited material can then be patterned to limit its extent underneath the transistor. The insulating pattern can then be reformed so as to only present a single insulating material.

The implantation mask can also be used as etching mask when anisotropic etching is performed, for example by choosing to etch insulating pattern 7 in the uncovered area until sacrificial material 9 and/or additional sacrificial material 10 is reached.

In advantageous manner, the hole which enabled access to the sacrificial materials is filled so as to prevent dust from remaining stuck in the hole which is detrimental to the reliability of the device. This possibility is particularly interesting when access to the electrically insulating layer has been made via insulating pattern 7, which generally results in the presence of a hole of large size.

Figure 6:
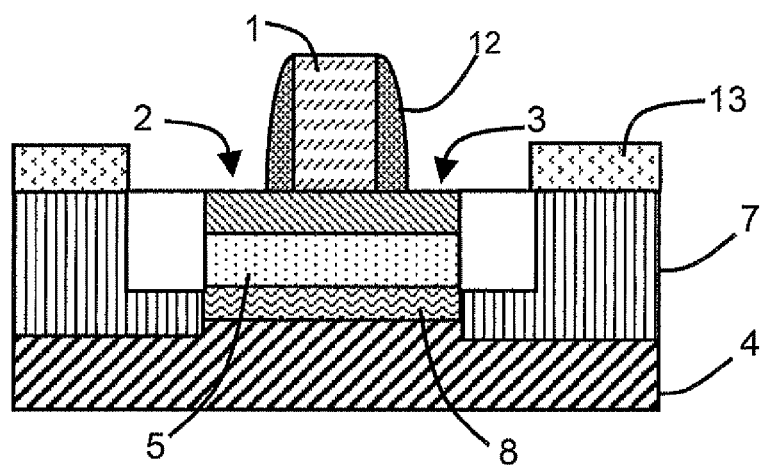

In another embodiment illustrated in FIG. 6, there is no formation of a sacrificial material in electrically insulating layer 5. The initial substrate is identical to the one illustrated in FIG. 2 and described in the foregoing. An etching mask 13 is used to form a hole in insulating pattern 7 and/or in the semiconductor film so as to have access to the electrically insulating layer.

One access is formed on the side where source 2 is located, and another access is formed on the drain side. A degradation agent is then sent through the holes to partially eliminate the electrically insulating layer. The operating conditions of the etching step are chosen so as to preserve the initial material of electrically insulating layer 5 underneath the conduction channel.

This embodiment does not enable self-alignment of area 5a with respect to gate electrode 1 and therefore with respect to the conduction channel. Formation of the etching mask is performed with another photolithography step than that used to form gate electrode 1. However, this embodiment is simple to set up as it comprises few additional steps compared with a conventional integration layout.

In preferential manner, the access hole to electrically insulating layer 5 presents a degradation agent input surface parallel to the lateral surfaces of gate electrode 1 so as to have an etching front parallel to gate electrode 1. This particularity makes it possible to have an area 5a having a lateral surface parallel to the lateral surface of the gate.

Once partial degradation of electrically insulating layer 5 has been performed, the structure is identical to that illustrated in FIG. 5 and described in the foregoing. It is then possible to modify this structure by means of the embodiments already described in relation to FIG. 5.

In this embodiment, it is also possible not to form a hole but to use a material that is porous or permeable to the degradation agent so as to achieve elimination of the material constituting electrically insulating layer 5.

In a preferred embodiment, insulating pattern 7 comprises a top part made of porous or permeable material which forms the access to electrically insulating layer 5. Partial degradation of the electrically insulating layer then takes place so as to form area 5a without it being possible for dust to pass through the insulating pattern and penetrate into the void areas.

In this instance, a part of the insulating pattern and/or of semiconductor film 6 is made from a material that is porous or permeable to the degradation agent. As previously, to have an etching front parallel to the side wall of the gate, it is advantageous for the porous or permeable material to present an adjacent surface that is parallel to the longitudinal axis of the gate electrode.

In a particular embodiment that can be combined with the previous embodiments, silicidation of source/drain electrodes takes place before electrically insulating layer 5 is partially eliminated. This step sequencing enables the material serving the purpose of making the contact connections to be protected, thereby preserving satisfactory operation of the transistor.

Insulating pattern 7 can be formed by a material that reacts or does not react to the degradation agent of sacrificial material 9. If insulating pattern 7 is made from a material that is resistant to the etching agent, a hole is formed or a porous/permeable material is used to allow access to electrically insulating layer 5. It is then advantageous to form an additional sacrificial material 10 which provides greater room for manoeuvre for accessing the electrically insulating layer.

If insulating pattern 7 is made from a material which reacts with the etching agent, it is advantageous to form a hole or to limit the area for passage through the porous/permeable material. This precaution enables the consumption of insulating pattern 7 during partial etching of electrically insulating layer 5 to be reduced. It is also advantageous to form an additional sacrificial material 10 which provides greater room for manoeuvre for accessing the electrically insulating layer and reduces the time required for the etching step.

The invention claimed is:

1. A method for fabricating a field effect device comprising: providing a substrate that is successively provided with a support substrate, an electrically insulating layer with a first dielectric constant, a semiconductor material film, a gate dielectric material, a gate electrode, wherein a source area and a drain area are located in the semiconductor material film and separated by the gate electrode, partially eliminating the electrically insulating layer between the support substrate and the semiconductor film for forming suspended source and drain areas supported by a first mechanical support area arranged along the gate electrode between the semiconductor film and the support substrate, and depositing an electrically insulating material between the source and drain areas and the support substrate for forming first and second regions configured to have a lower dielectric constant than the support area between the support substrate and semiconductor film, wherein the substrate includes an insulating pattern surrounding the semiconductor material film and the electrically insulating layer; and the insulating pattern is at least partially eliminated to provide access to the electrically insulating layer.

2. The method according to claim 1, further comprising:
   forming two regions of sacrificial material in the electrically insulating layer by implanting an impurity through the semiconductor material film, the two regions of sacrificial material delineating the first mechanical support area, and
   eliminating the two regions of sacrificial material for forming the first and second regions and the first mechanical support area.

3. The method according to claim 1, further comprising:
   forming two regions of sacrificial material in the electrically insulating layer by implanting an impurity through the semiconductor material film, the two regions of sacrificial material delineating the first mechanical support area, and
   eliminating the two regions of sacrificial material for forming the first and second regions and the first mechanical support area.

4. The method according to claim 3, further comprising:
implanting the impurity in the insulating pattern for forming an additional sacrificial material in the insulating pattern, and
eliminating the additional sacrificial material for forming an etching path and accessing the two regions of sacrificial material.

5. The method according to claim 1, wherein the substrate includes a porous or permeable material configured to form an access path to the electrically insulating layer.

* * * * *